United States Patent
Liu (10) Patent No.: US 12,487,254 B2
(45) Date of Patent: Dec. 2, 2025

(54) PACKAGED CURRENT SENSOR INTEGRATED CIRCUIT

(71) Applicant: Allegro MicroSystems, LLC, Manchester, NH (US)

(72) Inventor: Shixi Louis Liu, Hooksett, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 181 days.

(21) Appl. No.: 18/182,434

(22) Filed: Mar. 13, 2023

(65) Prior Publication Data

US 2023/0221355 A1    Jul. 13, 2023

Related U.S. Application Data (63) Continuation-in-part of application No. 18/053,480, filed on Nov. 8, 2022, now Pat. No. 12,163,983,
(Continued)

(51) Int. Cl.
*G01R 15/20* (2006.01)
*G01R 19/00* (2006.01)
(Continued)

(52) U.S. Cl.
CPC ...... *G01R 15/202* (2013.01); *H01L 23/49575* (2013.01); *G01R 15/207* (2013.01); *G01R 19/0092* (2013.01); *G01R 33/072* (2013.01)

(58) Field of Classification Search
CPC ............ H01L 23/49575; G01R 15/207; G01R 19/0092; G01R 33/072
See application file for complete search history.

(56) References Cited

U.S. PATENT DOCUMENTS

| 5,255,157 A | 10/1993 | Hegel |
| 5,289,344 A | 2/1994 | Gagnon et al. |

(Continued)

FOREIGN PATENT DOCUMENTS

| EP | 3671228 | 6/2020 |
| EP | 4141451 | 3/2023 |
| FR | 3090121 | 6/2020 |

OTHER PUBLICATIONS

European Response filed on Jun. 14, 2023 for European Application No. 22183450.0; 24 pages.
(Continued)

*Primary Examiner* — David A Zarneke
(74) *Attorney, Agent, or Firm* — DALY, CROWLEY, MOFFORD & DURKEE, LLP (57) ABSTRACT

A current sensor circuit package includes a primary conductor having an input portion into which a current flows, an output portion from which the current flows, and an exposed portion, wherein the input and output portions have a reduced area edge. A secondary lead has an elongated portion that is offset with respect to the exposed portion of the secondary lead. A semiconductor die is disposed adjacent to the primary conductor on an insulator portion and at least one magnetic field sensing element is supported by the semiconductor die. A package body enclosing the semiconductor die and a portion of the primary conductor includes a first cutout in a first side edge configured to expose the reduced area edge of the input portion of the primary conductor and a second cutout on a second side edge configured to expose the reduced area edge of the output portion of the primary conductor, wherein the first side edge of the package body is substantially parallel with respect to the second side edge of the package body.

19 Claims, 7 Drawing Sheets

Related U.S. Application Data which is a continuation-in-part of application No. 17/654,254, filed on Mar. 10, 2022, now Pat. No. 11,768,229, which is a continuation-in-part of application No. 17/409,011, filed on Aug. 23, 2021, now Pat. No. 11,519,946.

(51) Int. Cl.
*G01R 33/07* (2006.01)
*H01L 23/495* (2006.01)

(56) References Cited

U.S. PATENT DOCUMENTS

| | | |
|---|---|---|
| 5,557,504 A | 9/1996 | Siegel et al. |
| 5,570,273 A | 10/1996 | Siegel et al. |
| 5,963,028 A | 10/1999 | Engel et al. |
| 6,211,462 B1 | 4/2001 | Carter, Jr. et al. |
| 6,265,865 B1 | 7/2001 | Engel et al. |
| 6,306,684 B1 | 10/2001 | Richardson et al. |
| 6,326,243 B1 | 12/2001 | Suzuya et al. |
| 6,356,068 B1 | 3/2002 | Steiner et al. |
| 6,781,359 B2 | 8/2004 | Stauth et al. |
| 6,995,315 B2 | 2/2006 | Sharma et al. |
| 7,005,754 B2 | 2/2006 | Howarth |
| 7,075,287 B1 | 7/2006 | Mangtani et al. |
| 7,166,807 B2 | 1/2007 | Gagnon et al. |
| 7,183,485 B2 | 2/2007 | Groothuis et al. |
| 7,259,545 B2 | 8/2007 | Stauth et al. |
| 7,265,531 B2 | 9/2007 | Stauth et al. |
| 7,301,229 B2 | 11/2007 | Yau |
| 7,372,147 B2 | 5/2008 | Dai et al. |
| 7,476,816 B2 | 1/2009 | Doogue et al. |
| 7,518,354 B2 | 4/2009 | Stauth et al. |
| 7,554,180 B2 | 6/2009 | McKerreghan et al. |
| 7,598,601 B2 | 10/2009 | Taylor et al. |
| 7,746,056 B2 | 6/2010 | Stauth et al. |
| 7,816,905 B2 | 10/2010 | Doogue et al. |
| 8,080,994 B2 | 12/2011 | Taylor et al. |
| 8,461,677 B2 | 6/2013 | Ararao et al. |
| 8,486,755 B2 | 7/2013 | Ararao et al. |
| 8,604,777 B2 | 12/2013 | Doogue et al. |
| 8,629,539 B2 | 1/2014 | Milano et al. |
| 8,907,437 B2 | 12/2014 | Milano et al. |
| 9,190,606 B2 | 11/2015 | Liu et al. |
| 9,228,860 B2 | 1/2016 | Sharma et al. |
| 9,299,915 B2 | 3/2016 | Milano et al. |
| 9,383,425 B2 | 7/2016 | Milano et al. |
| 9,411,025 B2 | 8/2016 | David et al. |
| 9,494,660 B2 | 11/2016 | David et al. |
| 9,620,705 B2 | 4/2017 | Milano et al. |
| 9,666,788 B2 | 5/2017 | Taylor et al. |
| 9,788,403 B2 | 10/2017 | Mrusek |
| 9,812,588 B2 | 11/2017 | Vig et al. |
| 9,865,807 B2 | 1/2018 | Liu et al. |
| 10,230,006 B2 | 3/2019 | Vig et al. |
| 10,234,513 B2 | 3/2019 | Vig et al. |
| 10,333,055 B2 | 6/2019 | Milano et al. |
| 10,345,343 B2 | 7/2019 | Milano et al. |
| 10,509,058 B2 | 12/2019 | Cadugan et al. |
| 10,578,684 B2 | 3/2020 | Cadugan et al. |
| 10,718,794 B2 | 7/2020 | El Bacha et al. |
| 10,753,963 B2 | 8/2020 | Milano et al. |
| 10,916,665 B2 | 2/2021 | Vig et al. |
| 11,024,576 B1 | 6/2021 | West et al. |
| 11,085,952 B2 | 8/2021 | Cadugan et al. |
| 11,183,436 B2 | 11/2021 | Liu et al. |
| 11,519,946 B1 | 12/2022 | Rock et al. |
| 11,538,744 B2 * | 12/2022 | Yandoc ............ H01L 23/49537 |
| 11,768,229 B2 | 9/2023 | Boden et al. |
| 2002/0190703 A1 | 12/2002 | Goto et al. |
| 2003/0193018 A1 | 10/2003 | Tao et al. |
| 2004/0124505 A1 | 7/2004 | Mahle et al. |
| 2005/0030018 A1 | 2/2005 | Shibahara et al. |
| 2005/0124185 A1 | 6/2005 | Cromwell et al. |
| 2007/0126092 A1 | 6/2007 | San Antonio et al. |
| 2007/0279053 A1 | 12/2007 | Taylor et al. |
| 2008/0297138 A1 | 12/2008 | Taylor et al. |
| 2010/0156394 A1 | 6/2010 | Ausserlechner et al. |
| 2011/0049685 A1 | 3/2011 | Park et al. |
| 2011/0234215 A1 | 9/2011 | Ausserlechner |
| 2011/0248711 A1 | 10/2011 | Ausserlechner |
| 2012/0080781 A1 * | 4/2012 | Li .................... H01L 23/49562 257/676 |
| 2012/0089266 A1 | 4/2012 | Tomimbang et al. |
| 2013/0015843 A1 | 1/2013 | Doogue et al. |
| 2013/0020660 A1 | 1/2013 | Milano et al. |
| 2013/0138372 A1 | 5/2013 | Ausserlechner |
| 2014/0253103 A1 | 9/2014 | Racz et al. |
| 2014/0264678 A1 | 9/2014 | Liu et al. |
| 2014/0266181 A1 | 9/2014 | Milano et al. |
| 2015/0108967 A1 | 4/2015 | Barczyk |
| 2015/0270198 A1 | 9/2015 | Cuoco et al. |
| 2015/0285874 A1 | 10/2015 | Taylor et al. |
| 2016/0187388 A1 | 6/2016 | Suzuki et al. |
| 2016/0216296 A1 | 7/2016 | Nakayama et al. |
| 2016/0223594 A1 | 8/2016 | Suzuki et al. |
| 2016/0282388 A1 | 9/2016 | Milano et al. |
| 2016/0282425 A1 | 9/2016 | Haas et al. |
| 2016/0313375 A1 | 10/2016 | Etschmaier |
| 2017/0179067 A1 | 6/2017 | Aoki et al. |
| 2017/0336481 A1 | 11/2017 | Latham et al. |
| 2018/0149677 A1 | 5/2018 | Milano et al. |
| 2018/0166350 A1 | 6/2018 | Racz et al. |
| 2018/0306843 A1 | 10/2018 | Bussing et al. |
| 2019/0006266 A1 | 1/2019 | Gomez et al. |
| 2019/0049527 A1 | 2/2019 | Vig et al. |
| 2019/0109072 A1 | 4/2019 | David et al. |
| 2019/0154737 A1 | 5/2019 | Nobira |
| 2019/0204363 A1 | 7/2019 | Suzuki et al. |
| 2019/0369144 A1 | 12/2019 | Mauder et al. |
| 2020/0033384 A1 | 1/2020 | Kishi et al. |
| 2020/0064382 A1 | 2/2020 | Takata et al. |
| 2020/0191835 A1 | 6/2020 | Bilbao de Mendizabal et al. |
| 2021/0082789 A1 | 3/2021 | Briano et al. |
| 2021/0111284 A1 | 4/2021 | Vig et al. |
| 2021/0243911 A1 | 8/2021 | Tang et al. |
| 2021/0263077 A1 | 8/2021 | Hirano et al. |
| 2021/0397015 A1 | 12/2021 | Moon |
| 2022/0018880 A1 | 1/2022 | Houis |
| 2023/0058695 A1 | 2/2023 | Boden et al. |
| 2023/0060219 A1 | 3/2023 | Liu et al. |

OTHER PUBLICATIONS

U.S. Appl. No. 18/512,122, filed Nov. 17, 2023, McNally et al.
Response to European Rules 161/162 Communication dated Aug. 19, 2024 for European Application No. 22847650.3; Response Filed Feb. 18, 2025; 21 Pages.
U.S. Appl. No. 18/490,815, filed Oct. 20, 2023, Briano, et al.
Response to European Examination Report dated Aug. 28, 2023 for European Application No. 22183450.0 as filed on Oct. 30, 2023; 18 pages.
U.S. Non-Final Office Action dated Oct. 1, 2024 for U.S. Appl. No. 18/053,480; 17 Pages.
Response to U.S. Non-Final Office Action dated Oct. 1, 2024 for U.S. Appl. No. 18/053,480; Response filed Oct. 7, 2024; 9 Pages.
Notice of Allowance dated Oct. 23, 2024 for U.S. Appl. No. 18/053,480; 7 pages.
U.S. Appl. No. 17/657,135, filed Mar. 30, 2022, Liu, et al.
U.S. Appl. No. 17/817,796, filed Aug. 5, 2022, Briano, et al.
Steve Bush, DNP claims world's thinnest chip package, https://www.electronicsweekly.com/news/products/micros/ dnp-claims-worlds-thinnest-chip-package-2009-03/ (Year: 2009).
Preliminary Amendment filed Jan. 12, 2022 for U.S. Appl. No. 17/409,011; 6 pages.
U.S. Notice of Allowance dated Aug. 23, 2022 for U.S. Appl. No. 17/409,011; 10 pages.
European Extended Search Reporting dated Dec. 22, 2022 for European Application No. 22183450.0; 7 pages.
Office Action dated Mar. 15, 2023 for U.S. Appl. No. 17/654,254, 19 pages.

(56) References Cited

OTHER PUBLICATIONS

Response to Office Action dated Mar. 15, 2023 filed Mar. 22, 2023 for U.S. Appl. No. 17/654,254, 10 pages.
Office Action dated May 19, 2023 for U.S. Appl. No. 17/654,254; 15 pages.
Response to Office Action dated May 19, 2023 filed May 25, 2023 for U.S. Appl. No. 17/654,254; 15 pages.
Search Reporting and Written Opinion dated Apr. 25, 2023 for PCT Application No. PCT/US2022/051968; 16 pages.
Notice of Allowance dated Aug. 9, 2023 for U.S. Appl. No. 17/654,254; 5 pages.
European Examination Report dated Aug. 28, 2023 for European Application No. 22183450.0, 4 pages.
European Examination Report dated Apr. 24, 2025 for European Application No. 22183450.0; 4 Pages.
U.S. Appl. No. 18/624,271, filed Apr. 2, 2024, Wang et al.
Allegro MicroSystems, LLC, "Thermal Design for Plastic Integrated Circuits;" Package Information document; Mar. 3, 2016; 4 Pages.
Beeker, "PCB Design Techniques to Improved ESD Robustness;" AMF-DES-T2360; PowerPoint Presentation; Oct. 2016; 72 Pages.
Chen, "The Intricacies of Lead Frames in the Semiconductor Industry;" Article Published Sep. 2, 2023; 12 Pages.
Sauber et al., "Guidelines for Designing Subassemblies Using Hall-Effect Devices;" Allegro MicroSystems, LLC Product Information Data Sheet AN277031, Rev. 19; May 4, 2021; 10 Pages.

\* cited by examiner

PACKAGED CURRENT SENSOR INTEGRATED CIRCUIT

CROSS-REFERENCE TO RELATED APPLICATIONS

This application is a continuation-in-part of and claims priority to and the benefit of U.S. patent application Ser. No. 18/053,480, entitled "Packaged Current Sensor Integrated Circuit" and filed Nov. 8, 2022, which is a continuation-in-part of and claims priority to and the benefit of U.S. patent application Ser. No. 17/654,254, entitled "Packaged Current Sensor Integrated Circuit" and filed on Mar. 10, 2022, which is a continuation-in-part of and claims priority to and the benefit of U.S. patent application Ser. No. 17/409,011, entitled "Packaged Current Sensor Integrated Circuit" filed Aug. 23, 2021 and issued on Dec. 6, 2022 as U.S. Pat. No. 11,519,946, the entirety of which are hereby incorporated herein by reference in their entireties.

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

SUMMARY

According to the disclosure, a current sensor integrated circuit package includes a primary conductor having an input portion into which a current flows, an output portion from which the current flows, and an exposed portion, wherein the input portion has a reduced area edge and the output portion has a reduced area edge, and a secondary lead having an exposed portion spaced from the exposed portion of the primary conductor by an isolation distance of at least 2.0 mm, wherein an elongated portion of the secondary lead is offset with respect to the exposed portion of the secondary lead. A semiconductor die disposed adjacent to the primary conductor is positioned on an insulator portion and at least one magnetic field sensing element is supported by the semiconductor die. A package body enclosing the semiconductor die and a portion of the primary conductor includes a first cutout in a first side edge configured to expose the reduced area edge of the input portion of the primary conductor and a second cutout on a second side edge configured to expose the reduced area edge of the output portion of the primary conductor, wherein the first side edge of the package body is substantially parallel with respect to the second side edge of the package body.

Features may include one or more of the following individually or in combination with other features. The reduced area edge of the input portion of the primary conductor is exposed at the first side edge of the package body, the reduced area edge of the output portion of the primary conductor is exposed at the second side edge of the package body, and the elongated portion of the secondary lead can extend in a direction parallel to the first and second side edges of the package body. The reduced area edge of the input portion of the primary conductor does not extend beyond the first side edge of the package body and the reduced area edge of the output portion of the primary conductor does not extend beyond the second side edge of the package body. The package body can be singulated along the reduced area edge of the input portion of the primary conductor and along the reduced area edge of the output portion of the primary conductor. The secondary lead can have a substantially constant thickness and be offset with respect to the exposed portion in a direction of a thickness of the secondary lead. The isolation distance can be at least 4.0 mm. The isolation distance can be at least 7.2 mm. The secondary lead can include a first secondary lead providing an output connection of the current sensor integrated circuit package, a second secondary lead providing a voltage input connection of the current sensor integrated circuit package, and a third secondary lead providing a ground connection of the current sensor integrated circuit package. The current sensor integrated circuit package can further include a front-end amplifier supported by the semiconductor die, wherein the at least one magnetic field sensing element is coupled to the front-end amplifier. The current sensor integrated circuit package can include at least two magnetic field sensing elements. The at least two magnetic field sensing elements can be Hall effect elements. The at least two magnetic field sensing elements can be coupled to provide a differential output. The secondary lead can provide a fault signal connection of the current sensor integrated circuit package. The current sensor integrated circuit package can further include a wafer backside coating material on a back of the semiconductor die. The current sensor integrated circuit package can include a second wafer backside coating material on the back of the semiconductor die. The exposed portion of the primary conductor can be substantially orthogonal to the first side edge of the package body and the second side edge of the package body. The insulator portion can extend beyond an edge of the primary conductor in a direction towards the secondary lead. The insulator portion can extend beyond the edge of the primary conductor in the direction towards the secondary lead by at least 0.1 mm. The insulator portion can extend beyond the edge of the primary conductor in the direction towards the secondary lead by at least 0.4 mm.

BRIEF DESCRIPTION OF DRAWINGS

The foregoing features of this disclosure, as well as the disclosure itself, may be more fully understood from the following description of the drawings in which.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall effect element, a vertical Hall effect element, and a Circular Vertical Hall (CVH) element. As is also known, there are different types of 'magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge, configured for single-ended or differential sensing. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). A coil may also be used to sense magnetic fields, which may be referred to as inductive sensing. Using a coil to sense a magnetic field is more typical as the frequency of the magnetic field to be sensed increases.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall effect elements tend to have axes of sensitivity perpendicular to a substrate, while metal based or metallic magnetoresistance elements (e.g., GMR, TMR, AMR) and vertical Hall effect elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
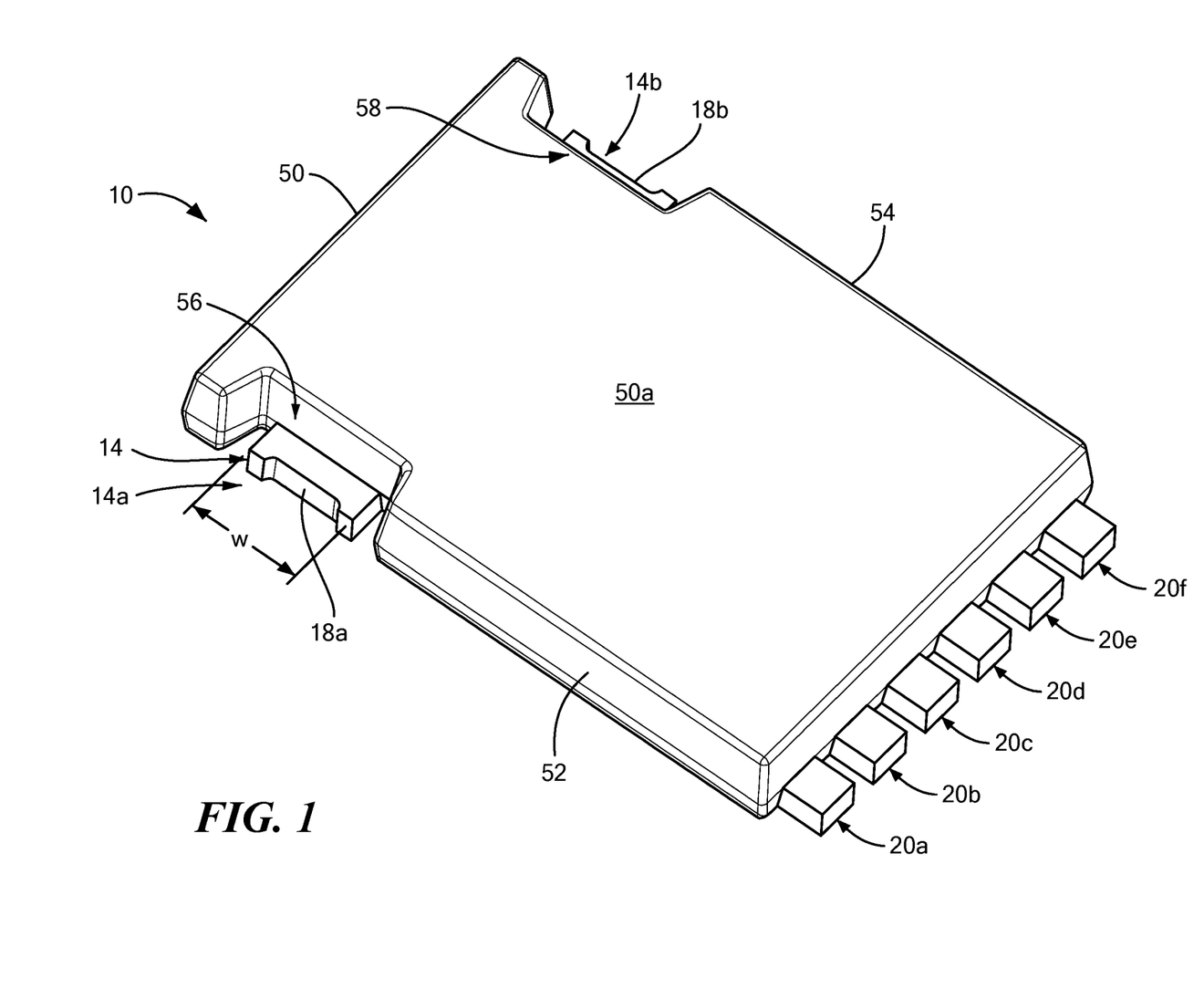
FIG. 1 is a perspective top view of a packaged current sensor integrated circuit according to the disclosure.
Figure 2:
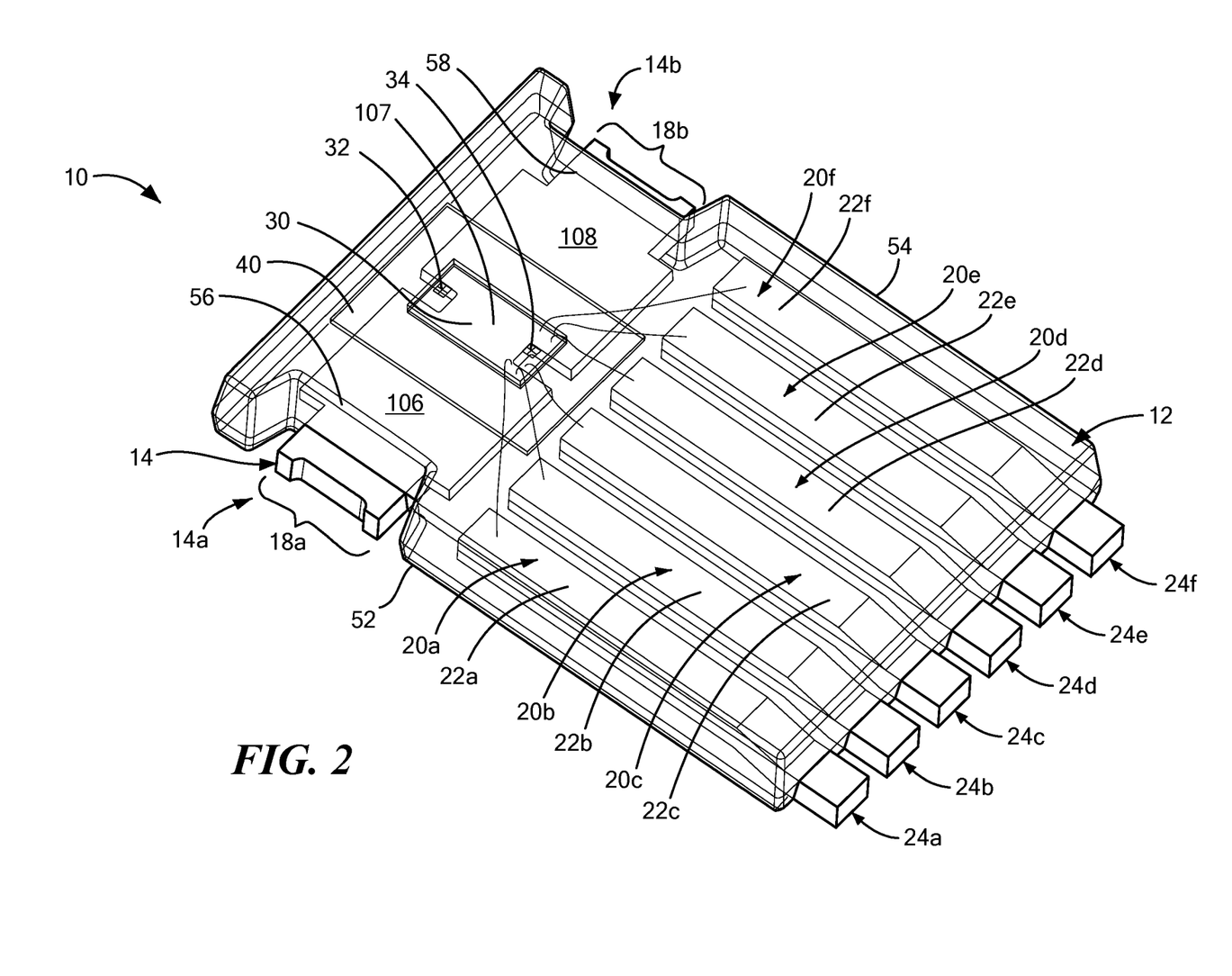
FIG. 2 shows the packaged current sensor integrated circuit of FIG. 1 with the package body in phantom.
Figure 3:
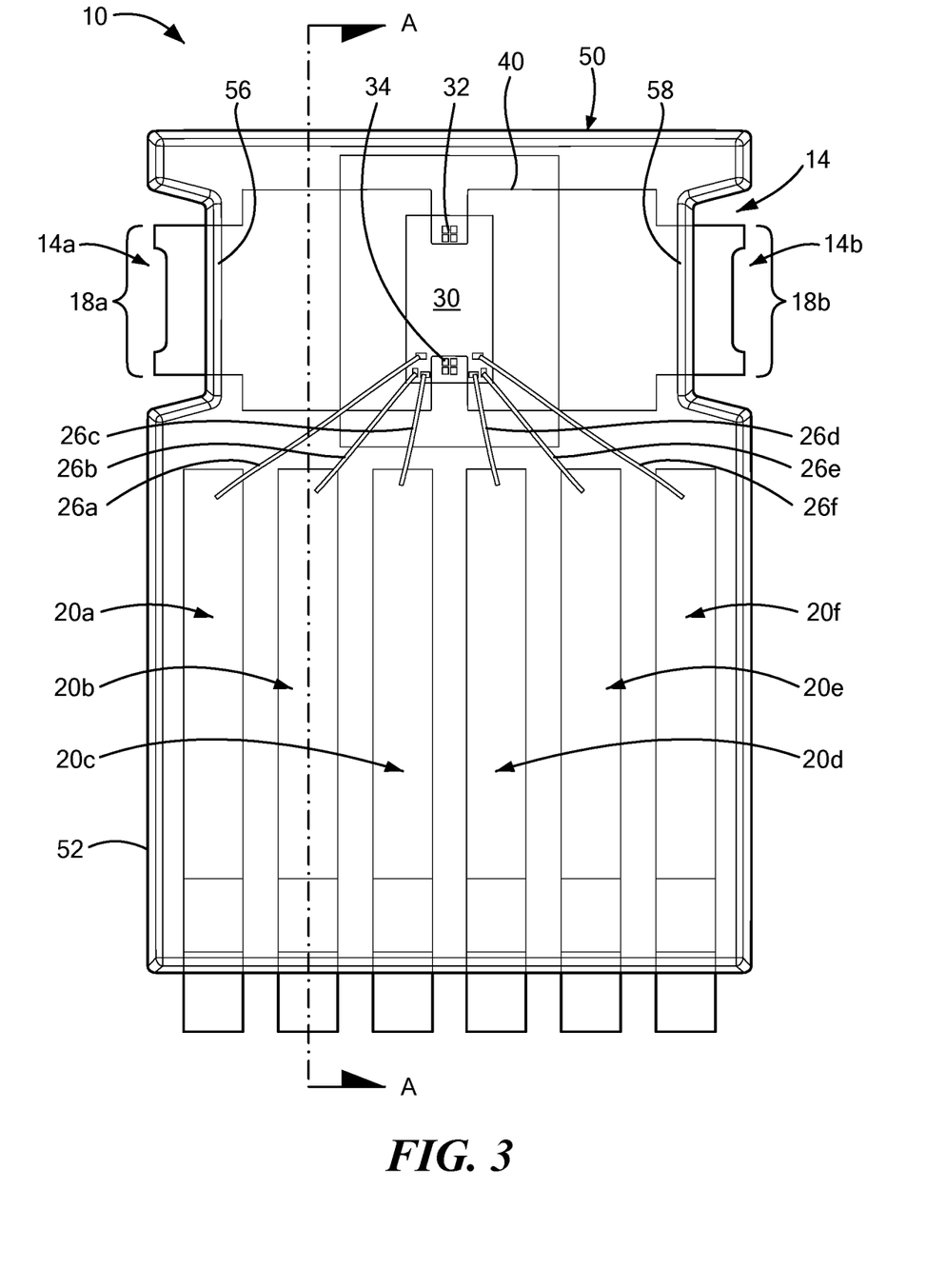
FIG. 3 is a top view of the packaged current sensor integrated circuit of FIG. 1 with the package body in phantom.
Figure 4:
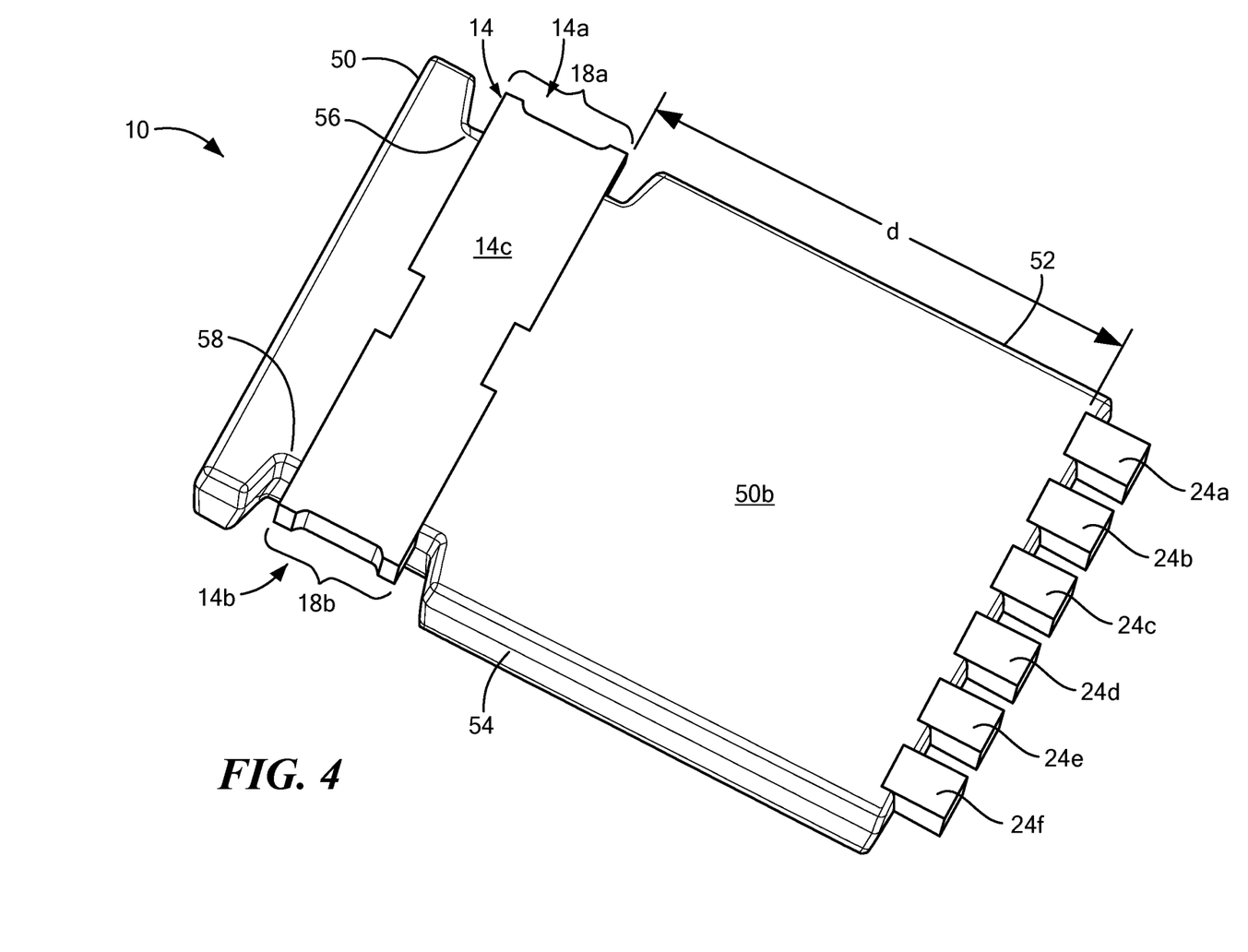
FIG. 4 is a bottom view of the packaged current sensor integrated circuit of FIG. 1.
Figure 5:
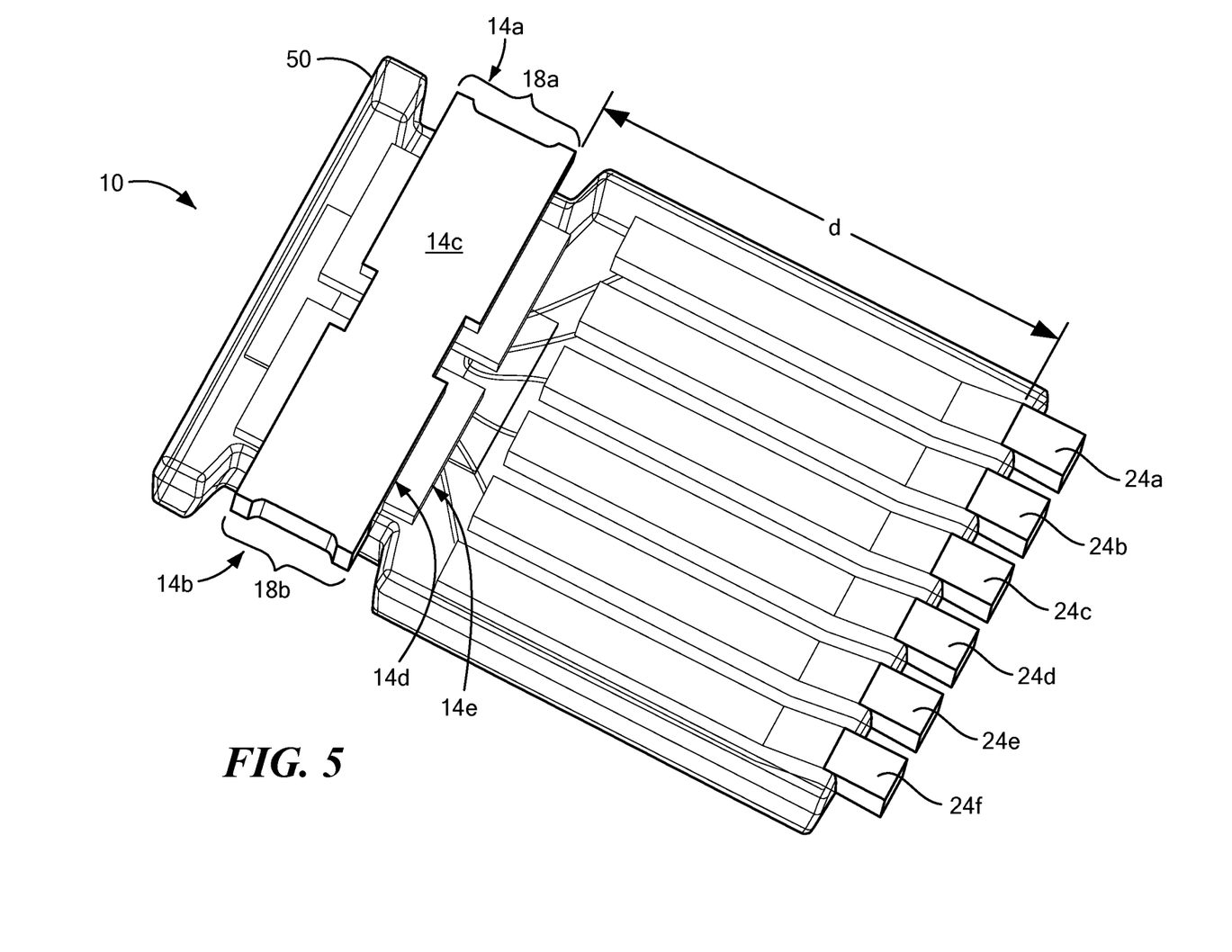
FIG. 5 is a bottom view of the packaged current sensor integrated circuit of FIG. 1 with the package body in phantom.

Referring to the various views of FIGS. 1-6, a packaged current sensor integrated circuit (IC) 10 includes a primary conductor 14 having an input portion 14a into which a current flows, an output portion 14b from which the current flows, and an exposed portion 14c (shown in the bottom views of FIGS. 4 and 5). A secondary lead, such as lead 20a, has an exposed portion 24a that is spaced from the exposed portion 14c of the primary conductor 14 by an isolation distance "d" (shown in the bottom views of FIGS. 4, 5, and 6). A semiconductor die 30 is disposed adjacent to the primary conductor 14 and is positioned on an insulator portion 40. At least one magnetic field sensing element 32, 34 is supported by the semiconductor die 30. A package body 50 encloses the semiconductor die 30 and a portion of the primary conductor 14 and has an upper package body surface 50a, a lower package body surface 50b, and side package edges 52, 54. A lead frame 12 (labeled in FIG. 2) includes the primary conductor 14 and one or more secondary leads (here a plurality of secondary leads 20a-20f)

According to an aspect of the disclosure, the input portion 14a of the primary conductor 14 has a reduced area edge 18a and the output portion 14b has a reduced area edge 18b. By reduced area edge it is meant that the edge surface has a reduced surface area as compared to a flat edge. Each example reduced area edge 18a, 18b has a notch between edge ends, as shown. The reduced area edges 18a, 18b provide tie bars which, during fabrication, are connected to like edges of primary conductors of adjacently fabricated packages. In other words, multiple current sensor integrated circuits are fabricated from a single lead frame (coupled together by tie bars in the form of the reduced area edges 18a, 18b) and are singulated along the side edges 52, 54 of the package body 50 through the reduced area edges 18a, 18b.

Providing primary conductor edges 18a, 18b along which the package is singulated (i.e., the connecting tie bar area) with a reduced area (i.e., as opposed a solid edge of a width "w" that needs to be cut) reduces the force required by the singulation process. For example, in the case of punching to singulate, the force required to punch through the reduced edge area is less and therefore, the IC package experiences lower stress and wear on the punch tool is reduced.

The example current sensor integrated circuit 10 has secondary leads 20a, 20b, 20c, 20d, 20e, 20f. In other embodiments, in which fewer than the illustrated six leads are required or more than the illustrated six leads are required for providing more power, ground, output signals, a fault signal, or other input and output pins, there may be fewer or more than six secondary leads. Wire bonds 26a, 26b, 26c, 26d, 26e, 26f connect the die 30 to the secondary, or signal leads, 20a, 20b, 20c, 20d, 20e, 20f, respectively, as shown in the views of FIGS. 2 and 3. In an embodiment, one or more secondary leads 20a, 20b, 20c, 20d, 20e, 20f can be connected to die 30 using two or more wire bonds. This may be advantageous when a potential for higher current exists in the operation of the integrated circuit, such as for a power or ground connection to die 30.

Secondary leads 20a-20f can be elongated from a first end adjacent to the primary conductor 14 to the exposed portion 24a-24f, respectively, and thus, can be described as having an elongated portion 22a, 22b, 22c, 22d, 22e, 22f. Secondary leads 20a-20f can have a substantially constant thickness "t" (labeled in FIG. 6).

Creepage refers to the shortest distance between primary and secondary conductors along a surface of any insulation material common to both parts, such as the lower surface 50b of the package body 50 outside of the package. The isolation distance "d" between the exposed portion 14c of the primary conductor 14 and the exposed portion 24a-24f of any secondary lead 20a-20f, respectively, provides the creepage distance and can be at least 2.0 mm.

Figure 6:
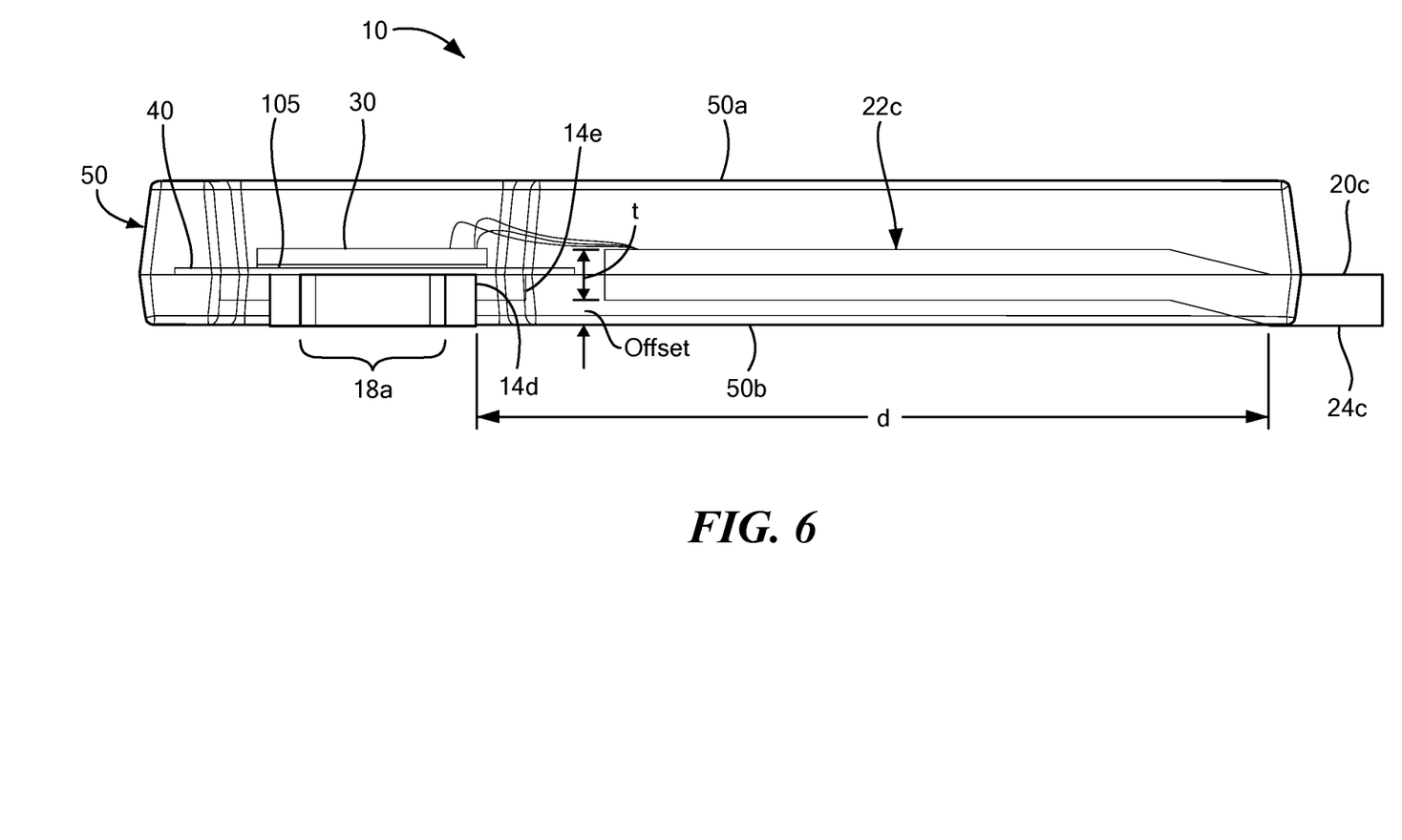
FIG. 6 is a cross-sectional side view of the packaged current sensor integrated circuit of FIG. 1 taken along the line A-A of FIG. 3.

According to a further aspect of the disclosure, the elongated portion 22a, 22b, 22c, 22d, 22e, 22f of the secondary leads 20a, 20b, 20c, 20d, 20e, 20f, and 20g, respectively, is offset with respect to the exposed portion 24a, 24b, 24c, 24d, 24e, 24f of the respective secondary lead in a direction of the package height or, in other words, the secondary leads 20a-20f are offset with respect to the exposed portions 24a-24f in the direction of a thickness "t" as shown (see FIG. 6). A typical lead thickness "t" can be on the order of 0.5 mm. In embodiments, the dimension of the offset of the secondary leads 20a-20f can be on the order of 0.25 mm. However, it will be appreciated by those of ordinary skill in the art that a smaller offset dimension, such as on the order of 0.1 mm, or a larger offset dimension are possible.

With this arrangement, achieving a desired creepage distance can be facilitated by providing the secondary leads 20a-20f with an offset elongated portion 22a-22f that is thereby encapsulated by the package body 50. In other words, by offsetting the secondary leads 20a-20f in this manner, the bottom surface of the elongated portion 22a-22f is encased by the mold material of the package body 50, resulting in the creepage distance "d" extending between the exposed portion 14c of the primary conductor 14 and the exposed portions 24a-24f of the secondary leads 20a-20f. Notably, this offset arrangement of secondary leads can achieve the same creepage as using secondary leads that have a thinned elongated portion formed by of a half etch process but can alleviate manufacturing challenges associated with half etch processing of long leads since such relatively long half etched secondary leads can be prone to bending.

In embodiments, the isolation, or creepage distance "d" is at least 7.2 mm and can be at least 8.0 mm. With a creepage distance of at least 7.2 mm, reinforced isolation according to a standard, such as IEC60664, is achieved for basic working voltages>1000 VRMS. In some embodiments, lower voltage isolation requirements may exist and the isolation distance "d" may be at least 1.0 mm, 2.0 mm, or 4.0 mm to meet certain isolation requirements in different applications.

Clearance refers to the shortest distance between conductors of differing voltage levels, such as between primary and secondary conductors, through an insulating material, such as air outside of the package or through an insulating material inside or outside the package.

Increased clearance distance in the described embodiments can be facilitated by the insulator portion 40 extending beyond an edge, such as a top edge 14e of the primary conductor 14 as shown in FIG. 6, since such extended insulator portion increases the clearance distance between the lower voltage level semiconductor die 30 and the higher voltage primary conductor 14. The insulator portion 40 extends beyond edge 14e of the primary conductor 14 in order to provide voltage isolation. In general (although the illustrated insulator portion 40 extends beyond the primary conductor edge 14e in an example embodiment), the insulator portion 40 need only extend beyond the die 30 by at least 200 microns and preferably by 400 microns. In an embodiment, the insulator portion 40 may extend beyond the edge 14e of the primary conductor 14 by at least 50 microns, and in another embodiment the insulator portion 40 extends beyond the edge 14e of the primary conductor 14 by at least 375 microns. An embodiment may have the insulator portion 40 not extend beyond the edge 14e of the primary conductor 14 where the other dimensions provide sufficient electrical isolation for the desired application.

In embodiments, the lead frame 12 can be stamped from a copper sheet and can be relatively thick (e.g., at least 15 mils thick) in order to support high current (e.g., 200 amps) applications. Alternatively, lead frame 12 can include interconnected metal layers as may be part of a so-called molded interconnect substrate (MIS) that includes a pre-molded structure with one or more layers, with each layer configured with plating or interconnects to provide electrical connections in the package.

Each of the input and output portions 14a, 14b of the primary current conductor 14 can include die attach portions 106, 108, respectively, and a current path portion 107. The primary conductor 14 supports insulator, or insulator portion 40, and semiconductor die 30. Die attach portions 106, 108 can alternatively be referred to as die attach pads or paddles. Die 30 supports at least one magnetic field sensing element, and, in an example embodiment, supports at least two magnetic field sensing elements 32, 34. The die 30 can also support circuitry to amplify and process signals from the magnetic field sensing elements 32, 34 and provide an output of the current sensor integrated circuit 10. As current flows through the primary conductor 14, a magnetic field is generated and may be sensed by magnetic field sensing elements 32, 34. In some embodiments, each element 32, 34 is comprised of a plurality of elements, such as four, as may be coupled in a bridge configuration.

In embodiments, the input portion 14a of the primary conductor 14 is exposed from the first side edge 52 of the package body 50 and the output portion 14b of the primary conductor 14 is exposed from the second side edge 54 of the package body that is substantially parallel with respect to the first side edge of the package body.

From the bottom views of FIGS. 4 and 5, it can be seen that each of the secondary leads 20a, 20b, 20c, 20d, 20e, 20f has an exposed portion 24a, 24b, 24c, 24d, 24e, 24f, respectively, on the bottom of the package. Further, lower surface 14c of the primary conductor 14 including at least a portion of die attach portions 106, 108, current conductor portion 107, and input and output portions 14a, 14b are also exposed on the bottom of package 10.

In use, exposed surface 14c of the primary conductor 14 may be connected to a circuit board or other substrate. For example, portions 106, 108 can be soldered to a PCB so that current can flow from portion 106 through portion 107 and to portion 108 to generate a magnetic field to be detected.

The current path portion 107 of the primary conductor 14 that interconnects die attach pads 106, 108 can be narrowed, as shown. Die attach pads 106, 108 may also act as primary current input and output portions, like a primary current lead. The primary conductor 14 has a partial current path that forms a line across the package body 50 from the first side edge 52 of the package to the second side edge 54 of the package. If die attach pads 106, 108 are used for primary current input and output leads or portions, then the current may not go through, or may be reduced through the input and output portions 14a, 14b of the primary conductor 14.

According to another aspect of the disclosure, the package body 50 has a first cutout 56 in the first side edge 52 configured to expose the reduced area edge 18a of the input portion 14a of the primary conductor 14 and a second cutout 58 in the second side edge 54 configured to expose the reduced area edge 18b of the output portion 14b of the primary conductor 14, wherein the first side edge 52 of the package body is substantially parallel with respect to the second side edge 54 of the package body. Cutouts 56, 58 in the package body 50 are shaped and sized to result in the input and output portions 14a, 14b of the primary conductor 14 being inside the outline of the substantially rectangular package body. Stated differently, the reduced area edge 18a of the input portion 14a of the primary conductor 14 does not extend beyond the first side edge 52 of the package body 50 and the reduced area edge 18b of the output portion 14b of the primary conductor 14 does not extend beyond the second side edge 54 of the package body. This arrangement advantageously prevents the IC packages from jamming in the tube during testing.

The magnetic field sensing elements 32, 34 are positioned off of or to the side of the current conductor portion 107 so that the magnetic field generated by the current flowing in the current conductor portion 107 has a directional component that is perpendicular, or in an embodiment near perpendicular (e.g., in some embodiments within +/−20 degrees of perpendicular and in other embodiments more than +/−20 degrees), to the die 30 such that planar Hall effect elements may be used for magnetic field sensing elements 32, 34. If the magnetic field sensing elements 32, 34 are Hall effect elements, one Hall effect element may be designed to have a positive voltage output when the magnetic field sensed is out of the die 30 (where for clarity "out" is the direction away from the current conductor portion 107), and the second Hall effect element may have a negative voltage when the magnetic field sensed is out of the die 30. Various processing circuitry is responsive to signals from the magnetic field sensing elements for generating an output signal indicative of the current through the current conductor portion 107. Such processing circuitry can include, but is not limited to an amplifier, and in some embodiments a differential amplifier, supported by the integrated circuit die 30 and configured to generate a signal indicative of the difference between the two Hall effect element output voltages. Using the difference between the two magnetic field sensing element output voltages when they are Hall effect elements allows for the integrated circuit to reduce or eliminate the effects of external magnetic fields that are not a result of current through the primary current path, including the current conductor portion 107 (i.e., stray magnetic fields). In other embodiments, the magnetic field sensing elements, or a magnetic field element may be positioned on die 30 over the primary current conductor portion 107 to sense a magnetic field with a component parallel to the surface of die 30. In a case where the magnetic field component to be sensed is parallel to the surface of the die 30, a vertical Hall effect element or a magnetoresistance element such as a GMR, TMR, or AMR element may be used.

Die 30 is supported by one or both of the die attach portions 106, 108 and is positioned over the insulator portion 40. Die 30 may be attached to the insulator portion 40 by a non-conductive coating (not shown), such as a wafer backside coating (WBC) or a non-conductive epoxy and the insulator portion 40 is attached to die attach portions 106, 108. Alternatively, the die 30 can be attached to the insulator portion 40 by a conductive material as may reduce the effects of partial discharge from voids in the die attach material. Die 30 may be attached to die attach portions 106, 108 by insulator portion 40 where the insulator is a dielectric tape, for example a Kapton® or other insulating tape with a layer of adhesive on one side of the tape or on each side of the dielectric tape layer. In another embodiment, an epoxy die attach material, a die-attach film (DAF), or an insulating coating material may be applied as the insulator portion 40 in place of the tape. Aspects of insulator portion 40 can be the same as or similar to insulation structures described in U.S. Pat. No. 10,753,963, issued on Aug. 25, 2020, entitled "Current Sensor Isolation" and hereby incorporated herein by reference in its entirety.

In manufacturing, if two layers of wafer backside coating are used, a first wafer backside coating layer 105 may be fully cured (or partially cured if only one layer of a wafer backside coating is used) before a second layer of wafer backside coating is partially cured (also known as B stage cured) to attach die 30 to insulator portion 40.

In another embodiment, the die 30 may be attached to the insulator portion 40 by other materials, including but not limited to a non-conductive die attach epoxy, or a tape. Multiple layers of wafer backside coating, tape, DAF and non-conductive epoxy may be used for electrical isolation. A combination of wafer backside coating, tape, DAF, or non-conductive epoxy may be used to achieve electrical isolation and attachment to the die attach portion 106, 108.

The insulator portion 40 can provide a second layer of isolation between the primary conductor 14 and wire bonds 26a-26f and secondary leads 20a-20f, which allows a thinner package than if a 0.4 mm distance were required. It will be appreciated that the isolation distances can be readily varied by stretching or shortening the length of the enclosed portion of the secondary leads in order to achieve a desired isolation voltage.

As noted above, the insulator portion 40 can extend beyond one or more edges, such as a top edge 14e and/or a side edge 14d of the primary conductor 14 in the direction of, or from the side of the primary conductor towards, the secondary leads 20a-20f. For example, in embodiments, the insulator portion 40 may extend beyond the top edge 14e of the primary conductor 14 in the direction of the secondary leads 20a-20f by at least 0.1 mm, 0.2 mm, or 0.4 mm depending on the voltage isolation requirements.

According to an example manufacture process, lead frame 12 is formed with primary current conductor 14 and secondary signal leads 20a-20f, following which insulation portion 40 is applied to the primary conductor. The insulation 40 may comprise one or more of a dielectric tape, an insulating epoxy material, or a piece of insulating material including but not limited to alumina or glass substrate material. The integrated circuit die 30 is then attached to the subassembly. Attachment of the die 30 can include, but is not limited to, use of a wafer backside coating material, a tape attachment material, and/or an insulating epoxy material, which may also be referred to as a non-conductive epoxy material.

The integrated circuit die 30 is electrically connected to the signal leads 20a-20f, such as with wire bonds 26a-26f, respectively. Other electrical connections, including flip-chip assembly methods, may be used provided they meet the isolation requirements of the application. Thereafter, a mold material is applied to the subassembly including the lead frame 12, integrated circuit die 30, and wire bonds 26a-26f in order to form package body 50.

After the mold process that forms the package body 50, the packages are cut, or singulated, with a process such punching, to form individual integrated circuit packages. Singulation results in the above-described configuration in which the primary conductor does not extend beyond the molds. As described above, advantageously, the reduced area edges 18a, 18b reduce the force required for punch singulation and thereby reduce the stress on the resulting IC packages and wear on the punch tool.

Other steps may follow manufacturing which include, but are not limited to a final test procedure, or programming the integrated circuit package. In the case of a current sensor integrated circuit package, there may be a test step and maybe programming of the integrated circuit die at the integrated circuit package level, and then a second test and programming may be performed, for example, when the current sensor integrated circuit package is applied to a printed circuit board or other assembly where the current sensor integrated circuit package is used. This second programming after assembly of the current sensor integrated circuit package onto a PC board or other assembly, allows a more accurate measurement of the current to be made as other influences such as PC board currents can be accounted for in the current sensor integrated circuit. As noted above, provision of cutouts 56, 58 in the side edges 52, 54 of package body 50 such that the reduced area edges 18a, 18b of the primary conductor 14 do not extend beyond the package body edges 52, 54 facilitates testing by reducing jamming of the package in the tube used for testing.

Figure 7:
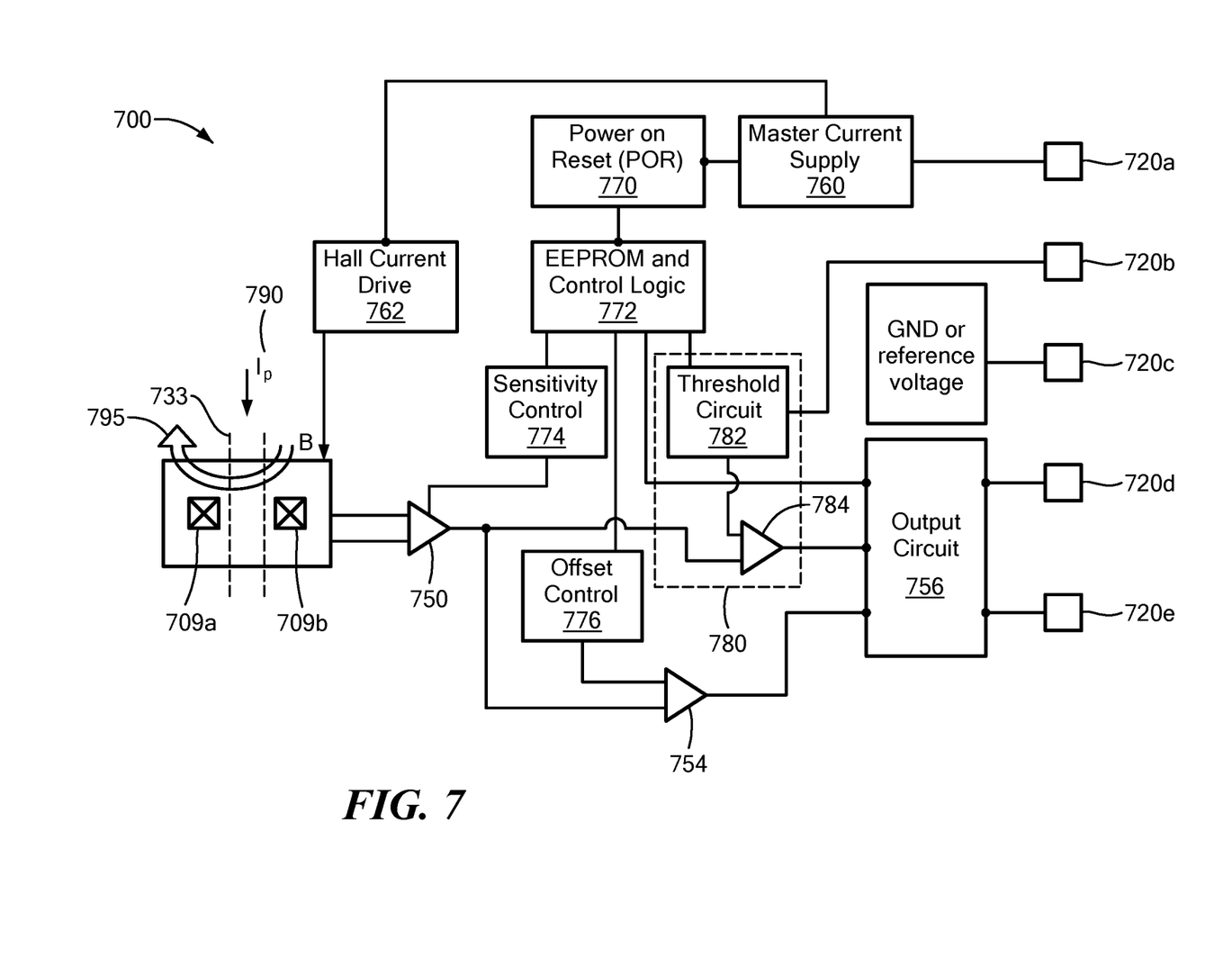
FIG. 7 is a schematic of an example current sensor.

Referring to FIG. 7, a schematic of an example circuit block diagram for an integrated circuit 700 which may be on the die 30 is shown. The primary current $I_p$ 790 flows through a current conductor portion 733 (that may be the same as or similar to primary conductor 14) and generates a magnetic field B 795. The magnetic field B 795 can contain a component which comes up into the die at magnetic field sensing element 709b and down into the magnetic field sensing element 709a. The magnetic field sensing elements 709a, 709b may be planar Hall effect plates for example. The magnetic field 795 results in Hall effect plates 709a, 709b providing a signal to a front-end amplifier 750. The front-end amplifier 750 provides an output to amplifier 754, which may be a linear amplifier, which feeds into an output circuit 756. Output circuit 756 may be a digital or analog circuit that provides an output to at least one bond pad 720d, 720e. Output bond pad 720e may be a linear output that represents the magnetic field 795 measured and amplified through the amplifier 754. Other numbers of output bond pads more than two may also be provided. In an alternate embodiment, the amplifier 754 may provide an output directly to bond pad 720e. Output bond pad 720d may be a fault output representative of a fault condition in the current sensor integrated circuit package.

Bond pad 720a provides a voltage and current input, typically Vcc, to provide power to the integrated circuit 700. A ground bond pad 720c may be provided to integrated circuit 700. In another embodiment, the voltage level provided at bond pad 720c may be other than ground, or a voltage above or below ground as a reference voltage to integrated circuit 700. Input bond pad 720a is coupled to a master current supply circuit 760 that provides power to the circuitry within integrated circuit 700. Although master current supply 760 is provided as a current supply, it would be apparent that voltages may also be provided to the circuits on integrated circuit 700. A Hall effect current drive circuit 762 takes current (or voltage) from the master current supply 760 and provides a regulated current to the Hall Effect sensing elements 709a, 709b. The master current supply 760 also provides power to a power on reset circuit 770. The power on reset circuit monitors the power coming into the circuit 700 and provides a signal to EEPROM and control logic circuit 772. The power on reset circuit 770 and EEPROM and control logic circuit 772 are used to configure and enable the integrated circuit, including the output circuit 756.

The EEPROM and control circuit 772 provides a signal to a sensitivity control circuit 774 which provides a signal to the front end amplifier 750 to adjust the sensitivity of the front end amplifier. The adjustment may be the result of a change in the power level in the circuit 700, or as a result of a temperature change of the circuit 700. An example of a temperature sensor circuit may include but is not limited to a diode temperature sensor, or the use of known temperature compensation resistors.

The EEPROM and control circuit 772 provides a signal to an offset control circuit 776. The offset control circuit 776 provides a signal to the amplifier 754. The offset control circuit 776 allows the circuit 700 to adjust the offset of the amplifier 754 for changes in power or temperature (the temperature compensation circuit is not shown) or a combination of temperature and power changes. The offset control circuit 776 may also provide adjustment for other offset sources, such as a stress in the integrated circuit die.

In another embodiment the EEPROM in the EEPROM and control circuit 772 may be replaced by another type of memory or used in combination with another type of non-volatile memory, including but not limited to a metal or polysilicon fuse, flash memory, or MRAM.

An input lead 720b may be provided to set a threshold for a fault indication circuit 780 (i.e., provide a fault trip level). In an embodiment, the input lead 720b provides a fault voltage level. The fault indication circuit 780 can include a threshold circuit 782 and a fault comparator 784. The EEPROM and control circuit 772 provides an input to the threshold circuit 782. The threshold circuit 782 provides a signal to the fault comparator 784, which compares the output of threshold circuit 782 with the output of the front end amplifier 750 to indicate when a fault exists to the output circuit block 756. The output circuit generates a fault output at output bond pad 720d. The fault output may indicate an overcurrent condition in which the current sensed in the current conductor path 733 exceeds a fault trip level, which trip level may be provided in the form of a fault voltage level on bond pad 720b. The fault allows, in one example, the user of the current sensor package 10 to turn off the current in the primary current path in order to prevent a high current condition in an electrical circuit connected to the primary conductor 14.

In an embodiment, functionality of the fault indication circuit 780 may be performed in a digital circuit or digital processor. The comparison to the fault trip level may include an analog to digital converter(ADC) prior to a digital logic circuit, which may include a processor or microprocessor circuit, which compares the fault trip level voltage to a voltage provided by the front end amplifier and an ADC circuit to convert the analog voltage of the front end amplifier 750 to a digital voltage. In an embodiment, the amplifier 750 may be a buffer amplifier with a gain near or equal to unity (or one). In another embodiment, the amplifier 754 may be introduce a non-unity gain.

In an embodiment, a multiplexer circuit may be used to allow for the output of front end amplifier circuit 750 and the fault trip level voltage to use the same ADC. It will be apparent to those of ordinary skill in the art that other circuits, such as timing circuits and sample and hold circuits, may be used to implement a multiplexed digital circuit.

It is understood that any of the above-described processing may be implemented in hardware, firmware, software, or a combination thereof. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of elements can refer to either a direct or an indirect coupling, and a positional relationship between entities can be a direct or indirect positional relationship. As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s). Relative or positional terms including, but not limited to, the terms "upper," "lower," "right," "left," "vertical," "horizontal," "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A current sensor integrated circuit package comprising:
a primary conductor having an input portion into which a current flows, an output portion from which the current flows, and an exposed portion, wherein the input portion has a reduced area edge and the output portion has a reduced area edge;
a secondary lead having an exposed portion spaced from the exposed portion of the primary conductor by an isolation distance of at least 2.0 mm, wherein an elongated portion of the secondary lead is offset with respect to the exposed portion of the secondary lead;
a semiconductor die disposed adjacent to the primary conductor and positioned on an insulator portion;
at least one magnetic field sensing element supported by the semiconductor die, wherein the at least one magnetic field sensing element is configured to generate a signal corresponding to the current that flows in the primary conductor; and
a package body enclosing the semiconductor die and a portion of the primary conductor and comprising a first cutout in a first side edge configured to expose the reduced area edge of the input portion of the primary conductor and a second cutout on a second side edge configured to expose the reduced area edge of the output portion of the primary conductor, wherein the first side edge of the package body is substantially parallel with respect to the second side edge of the package body.

2. The current sensor integrated circuit package of claim 1 wherein the reduced area edge of the input portion of the primary conductor is exposed at the first side edge of the package body, wherein the reduced area edge of the output portion of the primary conductor is exposed at the second side edge of the package body, and wherein the elongated portion of the secondary lead extends in a direction parallel to the first and second side edges of the package body.

3. The current sensor integrated circuit package of claim 2 wherein the reduced area edge of the input portion of the primary conductor does not extend beyond the first side edge of the package body and wherein the reduced area edge of the output portion of the primary conductor does not extend beyond the second side edge of the package body.

4. The current sensor integrated circuit package of claim 1 wherein the package body is singulated along the reduced area edge of the input portion of the primary conductor and along the reduced area edge of the output portion of the primary conductor.

5. The current sensor integrated circuit package of claim 1 wherein the secondary lead has a substantially constant thickness and wherein the secondary lead is offset with respect to the exposed portion in a direction of a thickness of the secondary lead.

6. The current sensor integrated circuit package of claim 1 wherein the isolation distance is at least 4.0 mm.

7. The current sensor integrated circuit package of claim 1 wherein the isolation distance is at least 7.2 mm.

8. The current sensor integrated circuit package of claim 1 wherein the secondary lead comprises a first secondary lead providing an output connection of the current sensor integrated circuit package, a second secondary lead providing a voltage input connection of the current sensor integrated circuit package, and a third secondary lead providing a ground connection of the current sensor integrated circuit package.

9. The current sensor integrated circuit package of claim 1 further comprising a front-end amplifier supported by the semiconductor die, wherein the at least one magnetic field sensing element is coupled to the front-end amplifier.

10. The current sensor integrated circuit package of claim 1 comprising at least two magnetic field sensing elements.

11. The current sensor integrated circuit package of claim 10 wherein the at least two magnetic field sensing elements are Hall effect elements.

12. The current sensor integrated circuit package of claim 11 wherein the at least two magnetic field sensing elements are coupled to provide a differential output.

13. The current sensor integrated circuit package of claim 1 wherein the secondary lead provides a fault signal connection of the current sensor integrated circuit package.

14. The current sensor integrated circuit package of claim 1 further comprising a wafer backside coating material on a back of the semiconductor die.

15. The current sensor integrated circuit package of claim 14 further comprising a second wafer backside coating material on the back of the semiconductor die.

16. The current sensor integrated circuit package of claim 1 wherein the exposed portion of the primary conductor is substantially orthogonal to the first side edge of the package body and the second side edge of the package body.

17. The current sensor integrated circuit of claim 1 wherein the insulator portion extends beyond an edge of the primary conductor in a direction towards the secondary lead.

18. The current sensor integrated circuit of claim 17 wherein the insulator portion extends beyond the edge of the primary conductor in the direction towards the secondary lead by at least 0.1 mm.

19. The current sensor integrated circuit of claim 17 wherein the insulator portion extends beyond the edge of the primary conductor in the direction towards the secondary lead by at least 0.4 mm.

* * * * *